US012598863B2

(12) United States Patent
Zhang et al.

(10) Patent No.: US 12,598,863 B2
(45) Date of Patent: Apr. 7, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Hongwei Zhang, Beijing (CN); Qiyun Wang, Beijing (CN); Zhenye Wei, Beijing (CN); Lulin Ma, Beijing (CN); Zhen Sun, Beijing (CN); Cheng Zeng, Beijing (CN); Li Chen, Beijing (CN); Xiongyi Luo, Beijing (CN); Guangri Yu, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 510 days.

(21) Appl. No.: 18/022,480

(22) PCT Filed: Apr. 21, 2022

(86) PCT No.: PCT/CN2022/088236
§ 371 (c)(1),
(2) Date: Feb. 21, 2023

(87) PCT Pub. No.: WO2023/201637
PCT Pub. Date: Oct. 26, 2023

(65) Prior Publication Data
US 2024/0276764 A1     Aug. 15, 2024

(51) Int. Cl.
| | |
|---|---|
| *H10K 59/12* | (2023.01) |
| *H10K 59/35* | (2023.01) |
| *H10K 59/80* | (2023.01) |
| *H10K 77/10* | (2023.01) |
| *H10K 102/00* | (2023.01) |

(52) U.S. Cl.
CPC ......... *H10K 59/1201* (2023.02); *H10K 59/35* (2023.02); *H10K 59/873* (2023.02);
(Continued)

(58) Field of Classification Search
CPC .. H10K 59/1201; H10K 59/35; H10K 59/873; H10K 59/879; H10K 77/10;
(Continued)

(56) References Cited

U.S. PATENT DOCUMENTS

| | | |
|---|---|---|
| 10,950,813 B2 | 3/2021 | Lee et al. |
| 2018/0047800 A1 | 2/2018 | Choi et al. |
(Continued)

FOREIGN PATENT DOCUMENTS

| | | |
|---|---|---|
| CN | 104981719 A | 10/2015 |
| CN | 107731868 A | 2/2018 |
(Continued)

OTHER PUBLICATIONS

CN202280000825.6 first office action dated Aug. 23, 2025.

*Primary Examiner* — Kevin Quarterman
(74) *Attorney, Agent, or Firm* — IPro, PLLC

(57) ABSTRACT

The present disclosure provides a display panel and a display apparatus. The display panel includes: a substrate, including a plurality of sub-pixel regions; a plurality of light emitting devices, located on one side of the substrate and corresponding to the sub-pixel regions one by one; a first pixel definition layer, located on one side, facing away from the substrate, of the light emitting devices and including first opening regions corresponding to the sub-pixel regions one by one; a plurality of quantum dot layers, located on the side, facing away from the substrate, of the light emitting devices and located in at least part of the first opening regions; and a plurality of first refractive index patterns, located between the light emitting devices and the quantum dot layers, where (Continued)

a refractive index of each quantum dot layer is greater than that of each first refractive index pattern.

20 Claims, 9 Drawing Sheets

(52) U.S. Cl.
CPC ........... *H10K 59/879* (2023.02); *H10K 77/10* (2023.02); *H10K 2102/302* (2023.02)

(58) Field of Classification Search
CPC ........... H10K 2102/302; H10K 50/844; H10K 50/854; H10K 2102/331; H10K 50/858; H10K 59/00; H10K 59/122; H10K 59/38; H10K 59/877; H10H 20/851; G02F 1/1336

See application file for complete search history.

(56) References Cited

U.S. PATENT DOCUMENTS

| | | | |
|---|---|---|---|
| 2020/0044125 A1 | 2/2020 | Chen et al. | |
| 2020/0081173 A1 | 3/2020 | Tak et al. | |
| 2021/0343895 A1 | 11/2021 | Pan | |
| 2021/0399260 A1 | 12/2021 | Kim et al. | |
| 2022/0052118 A1* | 2/2022 | Kim ........................ | H10K 59/38 |
| 2022/0137273 A1* | 5/2022 | Han ......................... | G02B 5/22 |
| | | | 359/885 |
| 2022/0157891 A1* | 5/2022 | Zhao ................... | H01L 25/0753 |
| 2022/0158043 A1* | 5/2022 | Lee ........................ | H10K 59/38 |
| 2022/0231087 A1* | 7/2022 | Jeon ....................... | H10K 59/12 |
| 2022/0352487 A1* | 11/2022 | Li ......................... | H10K 59/879 |
| 2024/0047626 A1* | 2/2024 | Chen ................. | H10H 20/8512 |

FOREIGN PATENT DOCUMENTS

| | | |
|---|---|---|
| CN | 108922906 A | 11/2018 |
| CN | 110568654 A | 12/2019 |
| CN | 110783441 A | 2/2020 |
| CN | 110928021 A | 3/2020 |
| CN | 111338007 A | 6/2020 |
| CN | 113809262 A | 12/2021 |
| CN | 114153091 A | 3/2022 |
| JP | 2013235141 A | 11/2013 |
| WO | 2012161012 A1 | 11/2012 |
| WO | 2022000692 A1 | 1/2022 |

* cited by examiner

DISPLAY PANEL AND DISPLAY APPARATUS

CROSS-REFERENCE TO RELATED APPLICATIONS

The disclosure is a National Stage of International Application No. PCT/CN2022/088236, filed on Apr. 21, 2022, which is hereby incorporated by reference in their entireties.

FIELD

The present disclosure relates to the technical field of displaying, in particular, a display panel and a display apparatus.

BACKGROUND

An Organic Light Emitting Diode (OLED) has the advantages of small thickness, high response speed, low driving voltage, wide operating temperature range, self-luminescence, low power, and capability of preparing flexible devices. It is one of the research hotspots in the field of display and lighting at home and abroad. However, the OLED has a wide luminescence spectrum, and a color domain coverage ratio of the OLED has reached a peak, limiting its development. A Quantum Dots Light Emitting Diode (QLED), as an emerging technology, has attracted people's attention and been researched in recent years because of its quantum confinement effect of a quantum dot material itself (under the quantum confinement effect, its continuous energy band changes into discrete energy levels, therefore, high-purity light with narrow peaks can be emitted). Quantum dots OLED (QD-OLED) devices with a relatively mature technology at this stage use non-pixelated blue-light OLED devices as backlight sources. Blue light excites red-light QDs and green-light QDs to respectively emit red light and green light, but a QD material absorbs a limited amount of blue backlight, which restrains the luminous efficiency of quantum dots. Furthermore, the blue light that is not absorbed by the QDs will leak to affect the color purity of the red light and the green light.

SUMMARY

The embodiments of the present disclosure provide a display panel, including:

a substrate, including a plurality of sub-pixel regions;

a plurality of light emitting devices, located on one side of the substrate and corresponding to the sub-pixel regions one by one;

a first pixel definition layer, located on one side, facing away from the substrate of the light emitting devices, and including first opening regions corresponding to the sub-pixel regions one by one;

a plurality of quantum dot layers, located on the side, facing away from the substrate, of the light emitting devices and located in at least part of the first opening regions; and a plurality of first refractive index patterns, located between the light emitting devices and the quantum dot layers, where a refractive index of each quantum dot layer is greater than that of each first refractive index pattern.

In some embodiments, the first refractive index patterns include resin and first hollow particles dispersed in the resin.

In some embodiments, a diameter of each first hollow particle is greater than or equal to 20 nm and less than or equal to 200 nm.

In some embodiments, the display panel further includes: second refractive index patterns, at least located between a side surface of the first pixel definition layer and the quantum dot layers.

In some embodiments, a refractive index of each second refractive index pattern is less than that of each quantum dot layer.

In some embodiments, the display panel further includes:

an encapsulation layer, located between the first refractive index patterns and the light emitting devices; where the encapsulation layer includes a first inorganic encapsulation film, an organic encapsulation film and a second inorganic encapsulation film which are stacked;

where at least one of the first inorganic encapsulation film and the second inorganic encapsulation film includes: at least one group of first inorganic encapsulation sub-films and second inorganic encapsulation sub-films alternately arranged; and a refractive index of each first inorganic encapsulation sub-film is greater than a refractive index of each second inorganic encapsulation sub-film.

In some embodiments, each first inorganic encapsulation sub-film and each second inorganic encapsulation sub-film satisfy a following condition:

$$\lambda/(4 \times N_1) + \lambda/(4 \times N_2) = H_1 + H_2,$$

where $\lambda$ is a central wavelength of reflected light of an interface between the first inorganic encapsulation sub-film and the second inorganic encapsulation sub-film; $N_1$ is the refractive index of the first inorganic encapsulation sub-film; $N_2$ is the refractive index of the second inorganic encapsulation sub-film; $H_1$ is a thickness of the first inorganic encapsulation sub-film; and $H_2$ is a thickness of the second inorganic encapsulation sub-film.

In some embodiments, the display panel further includes a prism structure located on one side, facing away from the first refractive index patterns, of the quantum dot layers.

In some embodiments, the display panel further includes an entire scattering layer arranged on one side, facing away from the quantum dot layers, of the prism structure.

In some embodiments, the scattering layer includes a flat film and first scattering particles dispersed in the flat film.

In some embodiments, the plurality of light emitting devices are blue light emitting devices; the plurality of sub-pixel regions include: a plurality of red sub-pixel regions, a plurality of blue sub-pixel regions, and a plurality of green sub-pixel regions; and the first refractive index patterns and the quantum dot layers are only located in the first opening regions corresponding to the red sub-pixel regions and the green sub-pixel regions.

In some embodiments, when the display panel further includes the prism structure, an orthogonal projection of the prism structure on the substrate and the blue sub-pixel regions do not overlap each other.

In some embodiments, the display panel further includes:

a plurality of color resistances, located on one side, facing away from the first refractive index patterns, of the quantum dot layers; where the plurality of color resistances are located at least in part of the sub-pixel regions.

In some embodiments, the color resistances include a filter material and second hollow particles dispersed in the filter material.

In some embodiments, the plurality of sub-pixel regions include: a plurality of red sub-pixel regions, a plurality of blue sub-pixel regions, and a plurality of green sub-pixel regions; and the plurality of color resistances are all blue color resistances, and the plurality of color resistances at least include blue color resistances corresponding to the blue sub-pixel regions one by one.

In some embodiments, the plurality of color resistances further include: red color resistances corresponding to the red sub-pixel regions one by one, and a plurality of green color resistances corresponding to the green sub-pixel regions one by one; and the blue color resistances further include second scattering particles dispersed in the filter material.

In some embodiments, the refractive index of each first refractive index pattern is greater than or equal to 1.25 and less than or equal to 1.45.

In some embodiments, the thickness of each first refractive index pattern is greater than or equal to 1 micron and less than or equal to 4 microns.

A display apparatus provided by embodiments of the present disclosure includes the display panel provided by the embodiments of the present disclosure.

BRIEF DESCRIPTION OF THE DRAWINGS

In order to explain the technical solutions of the embodiments of the present disclosure more clearly, the following will briefly introduce the accompanying drawings used in the description of the embodiments. Apparently, the drawings in the following description are only some embodiments of the present disclosure. Those of ordinary skill in the art can obtain other drawings based on these drawings without creative work.

DETAILED DESCRIPTION OF THE EMBODIMENTS

Figure 1:
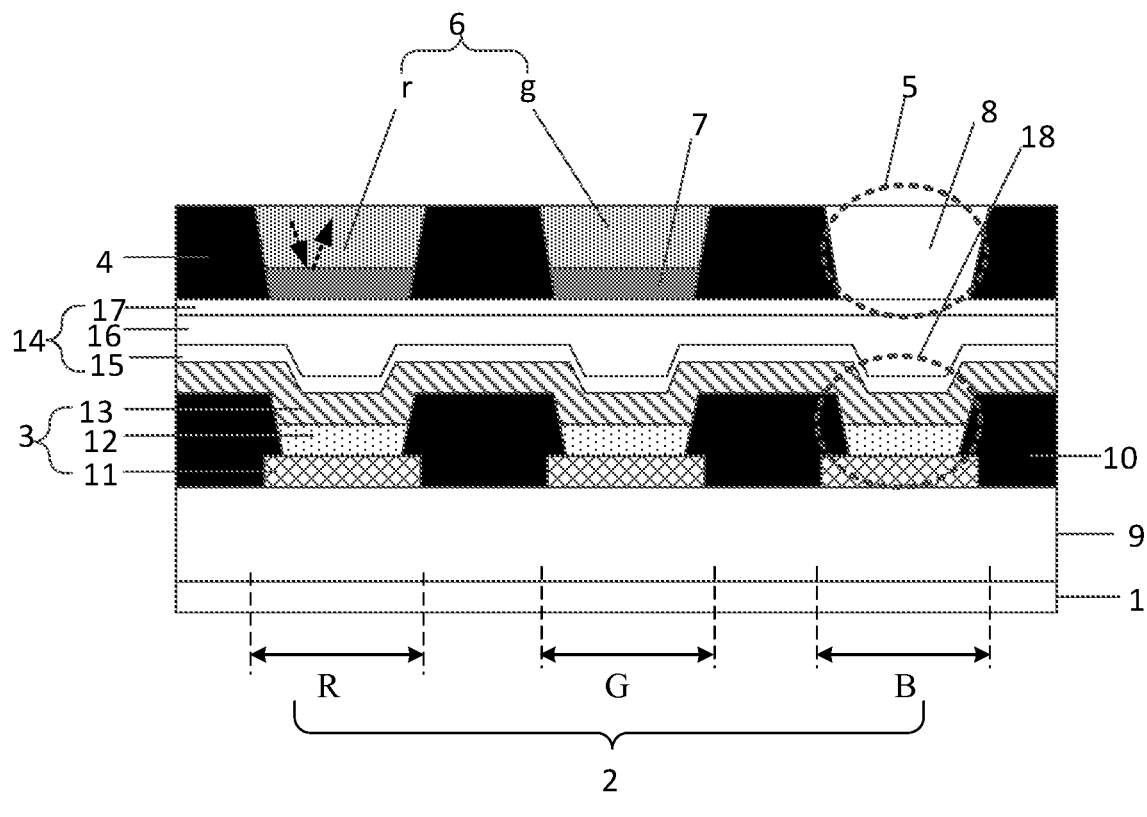
FIG. 1 is a schematic structural diagram of a display panel provided by an embodiment of the present disclosure.

In order to make the objectives, technical solutions and advantages of the embodiments of the present disclosure clearer, the technical solutions in the embodiments of the present disclosure are described clearly and completely below in conjunction with the accompanying drawings in the embodiments of the present disclosure. Obviously, the described embodiments are a part of the embodiments of the present disclosure, not all the embodiments. Furthermore, the embodiments in the present disclosure and features in the embodiments may be combined with each other without conflicts. Based on the described embodiments of the present disclosure, all other embodiments obtained by those ordinarily skilled in the art without creative work shall fall within the protection scope of the present disclosure.

Unless otherwise defined, technical terms or scientific terms used in the present disclosure shall be ordinary meanings as understood by those of ordinary skill in the art of the present disclosure. The words "first", "second" and similar terms used in the present disclosure do not denote any order, quantity or importance, but are merely used to distinguish different components. The word "including" or "includes" or the like means that the element or item preceding the word covers the element or object listed after the word and its equivalent, without excluding other elements or objects. The words "connection" or "connected" and the like are not limited to physical or mechanical connections, but may include electrical connections, whether direct or indirect.

It should be noted that the sizes and shapes of all patterns in the drawings do not reflect real scales, and are merely to illustrate the contents of the present disclosure. Furthermore, same or similar numerals throughout indicate same or similar elements or elements with same or similar functions.

Embodiments of the present disclosure provide a display panel, as shown in FIG. 1, including:

a substrate 1, including a plurality of sub-pixel regions 2;

a plurality of light emitting devices 3, located on one side of the substrate 1 and corresponding to the sub-pixel regions 2 one by one;

a first pixel definition layer 4, located on one side, facing away from the substrate 1, of the light emitting devices 3; where the first pixel definition layer 4 includes first opening regions 5 corresponding to the sub-pixel regions 2 one by one;

a plurality of quantum dot layers 6, located on the side, facing away from the substrate 1, of the light emitting devices 3; where plurality of quantum dot layers 6 are located in at least part of the first opening regions 5; and a plurality of first refractive index patterns 7, located between the light emitting devices 3 and the quantum dot layers 6, where a refractive index of each quantum dot layer 6 is greater than that of each first refractive index pattern 7.

It should be noted that the quantum dot layers of the display panel provided by the embodiments of the present disclosure are used for absorbing light emitted by the light emitting devices to radiate light in a desired color. Specifically, the color of the light radiated by the quantum dot layer is the same as a color of the sub-pixel region corresponding to the quantum dot layer.

According to the display panel provided by the embodiments of the present disclosure, the first refractive index patterns are arranged between the quantum dot layers and the light emitting devices. The light emitted by some quantum dot layers and light that is not absorbed by the quantum dot layers may be emitted towards one side of the first refractive index patterns. Since the refractive index of each quantum dot layer is greater than that of each first refractive index pattern, when the light is propagated to interfaces between the quantum dot layers and the first refractive index patterns, total reflection will occur. Therefore, the light that is not absorbed by the quantum dot layers will be reused. The light emitted by the quantum dot layers will also be finally emitted from a front surface of the side, facing away from the first refractive index patterns, of the quantum dot layers through multiple reflections, so as to increase the light utilization rate, increase a brightness conversion rate of the quantum dot layers, reduce leakage of light emitted by the light emitting devices, and improve the color purity of the display panel.

In some embodiments, as shown in FIG. 1, the first refractive index patterns 7 are located in the first opening regions 5 and are in contact with the quantum dot layers 6.

In some embodiments, the first refractive index patterns include resin and first hollow particles dispersed in the resin.

According to the display panel provided by the embodiments of the present disclosure, an effect of reducing the refractive index can be achieved by adding the first hollow particles in the resin, thus facilitating realizing that the refractive index of the quantum dot layer is greater than that of the first refractive index pattern, so that the light may be totally reflected when it is propagated to the interface between the quantum dot layer and the first refractive index pattern.

In some embodiments, a diameter of each first hollow particle is greater than or equal to 20 nm and less than or equal to 200 nm.

In some embodiments, as shown in FIG. 1, the plurality of sub-pixel regions 2 include: a plurality of red sub-pixel regions R, a plurality of blue sub-pixel regions B, and a plurality of green sub-pixel regions G.

In some embodiments, the plurality of light emitting devices are all blue light emitting devices. As shown in FIG. 1, the first refractive index patterns 7 and the quantum dot layers 6 are only located in the first opening regions 5 corresponding to the red sub-pixel regions R and the green sub-pixel regions G.

Specifically, as shown in FIG. 1, red-light quantum dot layers r are arranged in the first opening regions 5 corresponding to the red sub-pixel regions R, and the red-light quantum dot layers r absorb blue light and radiate red light; and green-light quantum dot layers g are arranged in the first opening regions 5 corresponding to the green sub-pixel regions G, and the green-light quantum dot layers g absorb blue light and radiate green light. Since the light emitting devices are the blue light emitting devices, the blue sub-pixel regions B can also enable the display panel to realize full-color display without quantum dot layers.

In specific implementation, a material of each quantum dot layer includes a core-shell quantum dot structure. A core material in the core-shell quantum dot structure may be cadmium selenide (CdSe) or indium phosphide (InP), and a shell material in the core-shell quantum dot structure may be zinc sulfide (ZnS).

In some embodiments, as shown in FIG. 1, the display panel further includes a light-transmissive filling structure 8, which is used for filling the first opening regions 5 corresponding to the blue sub-pixel regions B.

In specific implementation, the filling structure and the first pixel definition layer can both include resin materials. The first pixel definition layer includes a shading resin material, and the filling structure includes a light-transmissive resin material.

Figure 2:
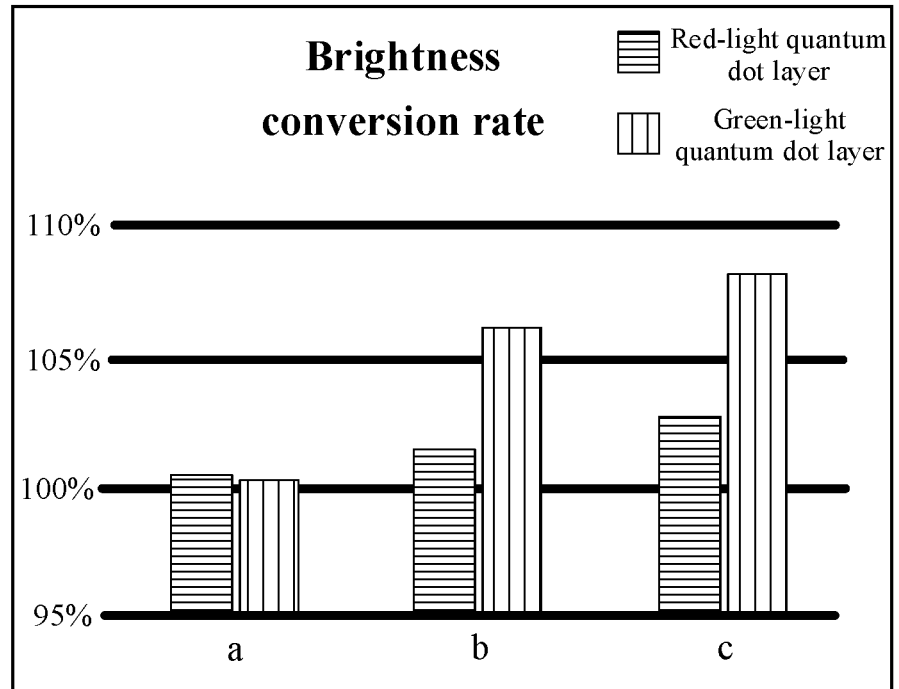
FIG. 2 is a diagram of a test result of a brightness conversion rate of a display panel provided by an embodiment of the present disclosure.

Next, the blue light emitting devices serving as the light emitting devices are taken for an example to illustrate a test result of a brightness conversion rate of the quantum dot layers. The test result is as shown in FIG. 2, where no first refractive index pattern is arranged on display panel a, and display panels b and c are both provided with first refractive index patterns between the light emitting devices and the quantum dot layers. A refractive index of the first refractive index patterns in the display panel b is 1.4, and a refractive index of the first refractive index patterns in the display panel c is 1.35. According to the test result, the introduction of the first refractive index patterns can effectively increase the brightness conversion rate of the quantum dot layers. Compared with the display panel a, the brightness conversion rates of the red-light quantum dot layers and the green-light quantum dot layers are respectively increased by 1% and 6% after the display panel b is provided with the first refractive index patterns. In addition, according to the test result of the display panels b and c, when the refractive index of the first refractive index patterns decreases from 1.4 to 1.35, the brightness conversion rates of the red-light quantum dot layers and the green-light quantum dot layers are further respectively increased by 2.5% and 8%. It can be seen that the arrangement of the first refractive index patterns between the quantum dot layers and the light emitting devices can effectively improve the utilization rate of blue light and the brightness conversion rate of the quantum dot layers. Since the utilization rate of blue light and the brightness conversion rate of the quantum dot layers are improved, the leakage of blue light can also be reduced to improve the color purity of the devices.

In some embodiments, the refractive index of each first refractive index pattern is greater than or equal to 1.25 and less than or equal to 1.45. Thus, it can be ensured that when the light is propagated to the interface between the quantum dot layer and the first refractive index pattern for total reflection, a high brightness conversion rate of the quantum dot layer can be obtained.

In specific implementation, the refractive index of the first refractive index patterns can be selected according to actual needs. For example, the refractive index of the first refractive index patterns can be selected with reference to a desired brightness conversion index, the refractive index of the quantum dot layers and other factors.

In some embodiments, the thickness of each first refractive index pattern is greater than or equal to 1 micron and less than or equal to 4 microns.

It should be noted that when the thickness of each first refractive index pattern is greater than or equal to 1 micron and less than or equal to 4 microns, the brightness conversion rate of the quantum dot layer will increase as the thickness of the first refractive index pattern increases. In specific implementation, the thickness of each first refractive index pattern can be selected according to actual needs. For example, the thickness of each first refractive index pattern can be selected with reference to the brightness conversion index, a depth of the first opening region, a desired thickness of the quantum dot layer, and other factors.

Figure 3:
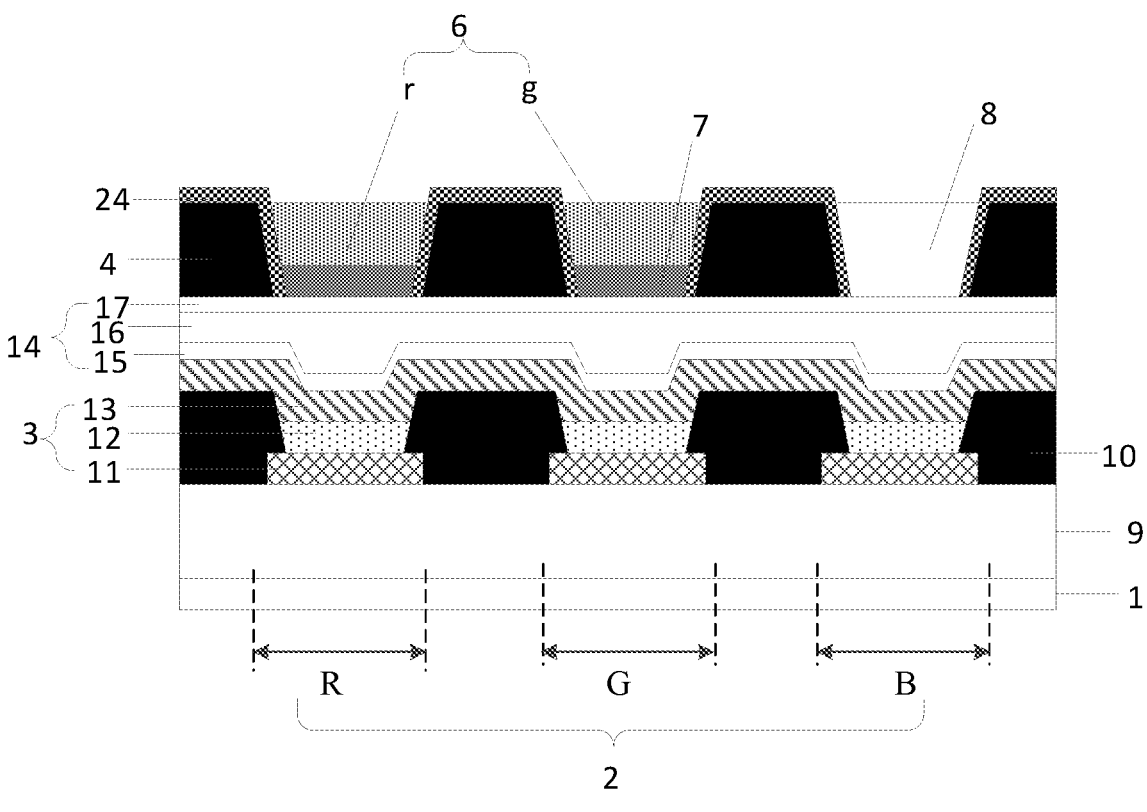
FIG. 3 is a schematic structural diagram of another display panel provided by an embodiment of the present disclosure.

In some embodiments, as shown in FIG. 3, the display panel further includes: second refractive index patterns 24, at least located between a side surface of the first pixel definition layer 4 and the quantum dot layers 6.

According to the display panel provided by the embodiments of the present disclosure, the second refractive index patterns are arranged at least between the side surface of the first pixel definition layer and the quantum dot layers, so that the second refractive index patterns can reflect the light emitted from the quantum dot layers horizontally for multiple times and finally turn it into forward light, to further improve the brightness conversion rate of the quantum dot layers.

In some embodiments, when the light emitting devices are all blue light emitting devices, as shown in FIG. 3, the second refractive index patterns 24 also cover side surfaces of the first pixel definition layer 4 of the first opening regions that are not provided with quantum dot layers 6. Thus, the light emitted by the blue light emitting devices and reaching the second refractive index patterns can be reflected for multiple times and finally turned into the forward light, which can improve the light utilization rate of the light emitting devices.

In some embodiments, as shown in FIG. 3, the second refractive index patterns 24 also cover a surface, facing away from one side of the substrate, of the first pixel definition layer 4 between adjacent first opening regions 5. That is, the second refractive index patterns cover the front and side surfaces of the first pixel definition layer. In this way, the preparation difficulty of the second refractive index patterns can be reduced in the specific implementation.

In some embodiments, a refractive index of each second refractive index pattern is less than that of each quantum dot layer.

In some embodiments, the refractive index of each second refractive index pattern is greater than or equal to 1.45 and less than or equal to 1.6.

In some embodiments, the second refractive index patterns include inorganic materials. The inorganic materials may be silicon oxide ($SiO_x$), silicon oxynitride (SiON), and the like.

In some embodiments, the light emitting devices are electroluminescent devices. The electroluminescent devices are, for example, OLED devices. Or, the electroluminescent devices may also be micro LEDs, mini LEDs and other light emitting devices.

Next, OLEDs serving as the light emitting devices are taken for example for illustration.

In some embodiments, as shown in FIG. 1, the display panel further includes: a driving circuit layer 9 located between the substrate 1 and the light emitting devices 3, a second pixel definition layer 10 located between the driving circuit layer 9 and the first pixel definition layer 4, and an encapsulation layer 14 located between the first refractive index patterns 7 and the second pixel definition layer 10. The second pixel definition layer 10 includes second opening regions 18 corresponding to the sub-pixel regions 2 one by one. Each of the light emitting devices 3 includes an anode 11, a light emitting function layer 12, and a cathode 13 which are stacked in the second opening region 18 in sequence. Where the anodes 11 are located between the second pixel definition layer 10 and the driving circuit layer 9; the second pixel definition layer 10 covers edges of the anodes 11; and the cathodes 13 corresponding to the plurality of sub-pixel regions 2 are connected into a whole. In some embodiments, the display panel may further include a light extraction layer located between the cathodes and the encapsulation layer.

Figure 4:
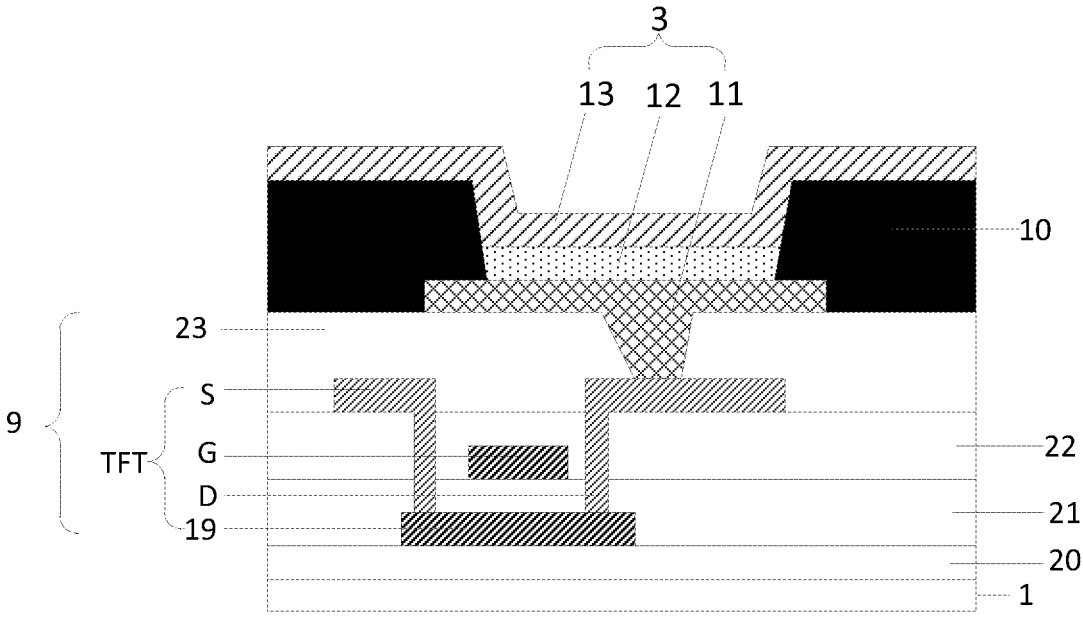
FIG. 4 is a schematic structural diagram of another display panel provided by an embodiment of the present disclosure.

In specific implementation, the driving circuit layer includes a plurality of pixel driving circuits arranged in an array. The pixel driving circuits are used for driving the light emitting devices to emit light. As shown in FIG. 4, each of the pixel driving circuits includes a thin film transistor (TFT) and a storage capacitor (not shown). The TFT includes: an active layer 19, a gate G, a source S and a drain D. In FIG. 2, the TFT serving as a top gate structure is taken as an example for illustration. Of course, the TFTs can also be bottom gates or other structures. As shown in FIG. 4, the display panel also includes a buffer layer 20 located between the substrate 1 and the active layer 19. The driving circuit layer 9 also includes a first gate insulation layer 21 located between the active layer 19 and the gate G, an interlayer insulation layer 22 located between the first gate insulation layer 21 and the source S and drain D, and a first flat layer 23 located between the light emitting device 3 and the source S and drain D. The anode 13 is connected with the drain D through a via hole penetrating the first flat layer 23.

In specific implementation, the light emitting functional layer includes an organic light emitting layer, and can also include an electron injection layer, an electron transport layer, a hole transport layer, a hole injection layer, and the like.

In specific implementation, when the light emitting devices are all blue light emitting devices, the organic light emitting layers corresponding to the sub-pixel regions emit blue light, but light emitting spectra of the organic light emitting layers corresponding to the sub-pixel regions may be the same or different.

In some embodiments, as shown in FIG. 1, the encapsulation layer 14 includes: a first inorganic encapsulation film 15, an organic encapsulation film 16, and a second inorganic encapsulation film 17.

In FIG. 1, the first inorganic encapsulation film 15, the organic encapsulation film 16, and the second inorganic encapsulation film 17 are all single-layer films.

Figure 5:
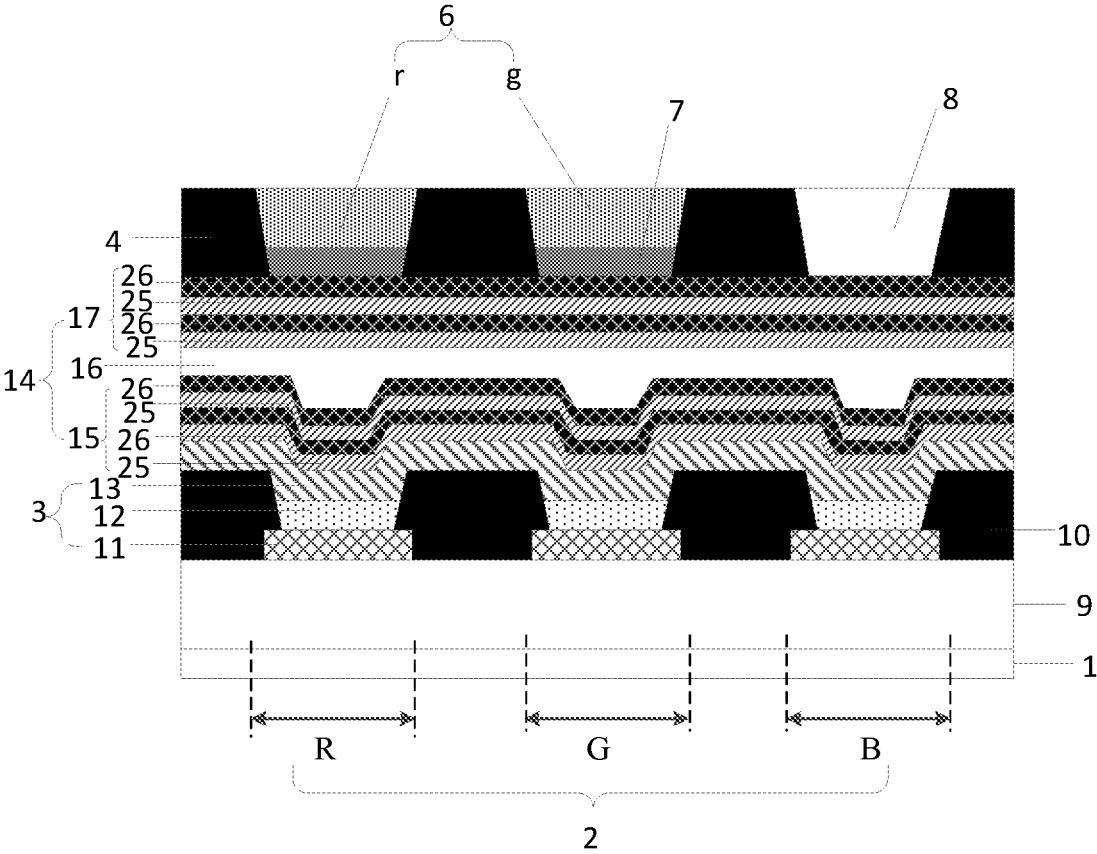
FIG. 5 is a schematic structural diagram of another display panel provided by an embodiment of the present disclosure.

Or, in some embodiments, as shown in FIG. 5, at least one of the first inorganic encapsulation film 15 and the second inorganic encapsulation film 17 includes: at least one group of first inorganic encapsulation sub-films 25 and second inorganic encapsulation sub-films 26 alternately arranged; and a refractive index of each first inorganic encapsulation sub-film 25 is greater than that of each second inorganic encapsulation sub-film 26.

According to the display panel provided by the embodiments of the present disclosure, the light emitted by some quantum dot layers and the blue light that is not absorbed will be emitted towards one side of the encapsulation layer. When the light is propagated to the encapsulation layer, since the first inorganic encapsulation film and/or the second inorganic encapsulation film includes at least one group of first inorganic encapsulation sub-films and second inorganic encapsulation sub-films alternately arranged, and the refractive index of the first inorganic encapsulation sub-films is greater than that of the second inorganic encapsulation sub-films, the interference between reflected light obtained by reflecting the light at interfaces between the first inorganic encapsulation sub-films and the second inorganic encapsulation sub-films increases the light reflectivity or the light transmittance within a specific wavelength range. Thus, the light propagated to one side of the substrate at the interfaces between the first inorganic encapsulation sub-films and the second inorganic encapsulation sub-films can be reflected back to the front surface for emitting, which can improve the light utilization rate and thus improve the brightness conversion rate of the quantum dot layers. At the same time, the leakage of the blue light can be reduced, and the color purity of the display panel can be improved.

In some embodiments, a material of the first inorganic encapsulation sub-films is SiON, and a material of the second inorganic encapsulation sub-films is silicon nitride (SiN).

It should be noted that in FIG. 5, taking the first inorganic encapsulation film and the second inorganic encapsulation film each including two groups of first inorganic encapsulation sub-films and second inorganic encapsulation sub-films alternately arranged for an example. That is, the first inorganic encapsulation film includes: a first inorganic encapsulation sub-film, a second inorganic encapsulation sub-film, a first inorganic encapsulation sub-film and a second inorganic encapsulation sub-film which are stacked in sequence on one side, facing away from the substrate, of the cathodes. The second inorganic encapsulation film includes a first inorganic encapsulation sub-film, a second inorganic encapsulation sub-film, a first inorganic encapsulation sub-film and a second inorganic encapsulation sub-film which are stacked in sequence on one side, facing away from the substrate, of the organic encapsulation film. The encapsulation layer is a composite structure including 9 layers of films. Of course, in specific implementation, the number of layers of films of the composite structure in the encapsulation layer can exceed 9, for example, 11, 18 or more.

Figure 6:
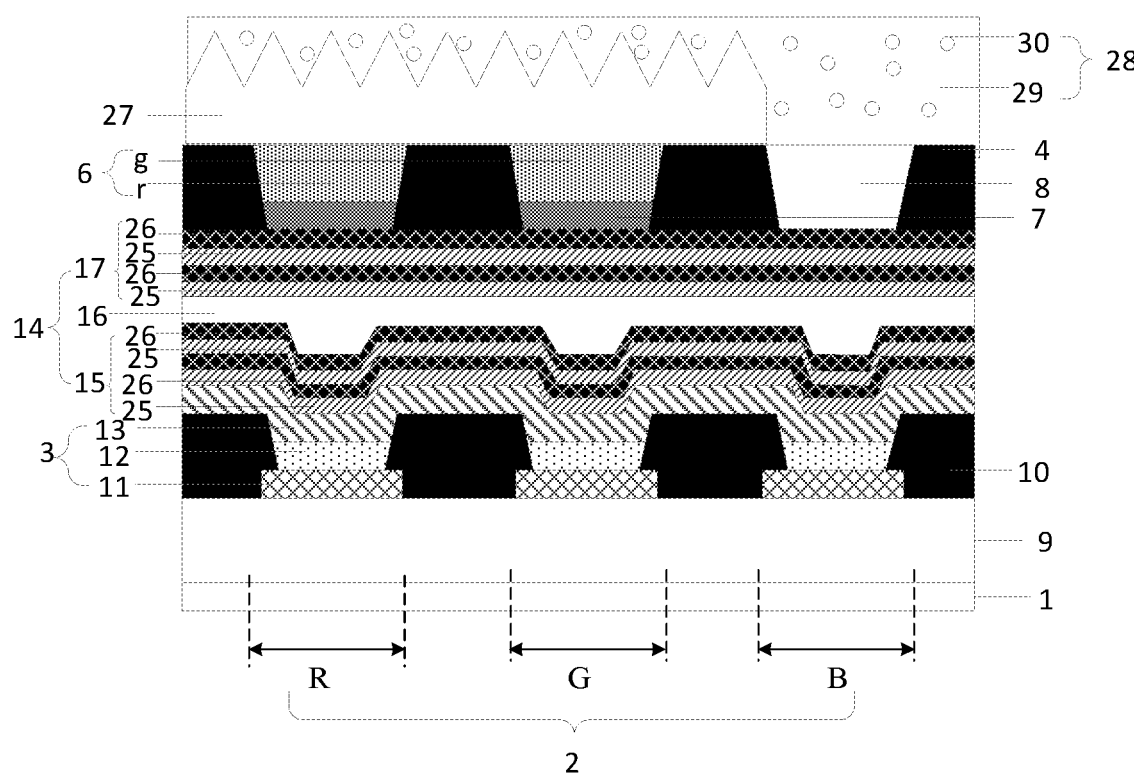
FIG. 6 is a schematic structural diagram of another display panel provided by an embodiment of the present disclosure.

Next, an encapsulation layer including 9 layers of films is taken as an example to illustrate a test result of the brightness conversion rate of the quantum dot layers. The test result is as shown in FIG. 6. After the encapsulation layer is changed from the traditional three-layer structure to a nine-layer structure, the brightness conversion rates of the red-light quantum dot layers and the green-light quantum dot layers are respectively increased by 1.1% and 2.2%. It can be seen that changing the number of layers of the encapsulation layer can effectively improve the light utilization rate and the brightness conversion rate of the quantum dot layers.

In specific implementation, increase in the light reflectivity or the light transmittance within a specific wavelength range can be realized through adjusting the thicknesses and the refractive indexes of the first inorganic encapsulation sub-films and the second inorganic encapsulation sub-films.

In some embodiments, each first inorganic encapsulation sub-film and each second inorganic encapsulation sub-film satisfy the following condition:

$$\lambda/(4 \times N_1) + \lambda/(4 \times N_2) = H_1 + H_2,$$

where $\lambda$ is a central wavelength of reflected light of an interface between the first inorganic encapsulation sub-film and the second inorganic encapsulation sub-film; $N_1$ is the refractive index of the first inorganic encapsulation sub-film; $N_2$ is the refractive index of the second inorganic encapsulation sub-film; $H_1$ is a thickness of the first inorganic encapsulation sub-film; and $H_2$ is a thickness of the second inorganic encapsulation sub-film.

In some embodiments, the transmittance and reflectivity of the first inorganic encapsulation film and the second inorganic encapsulation film are not completely the same. For example, it can be set that the first inorganic encapsulation film has the higher transmittance for blue light and green light and the higher reflectivity for red light, and the second inorganic encapsulation film has the higher reflectivity for green light.

In some embodiments, as shown in FIG. 6, the display panel further includes a prism structure 27 located on one side, facing away from the first refractive index patterns 7, of the quantum dot layers 6.

Figure 7:
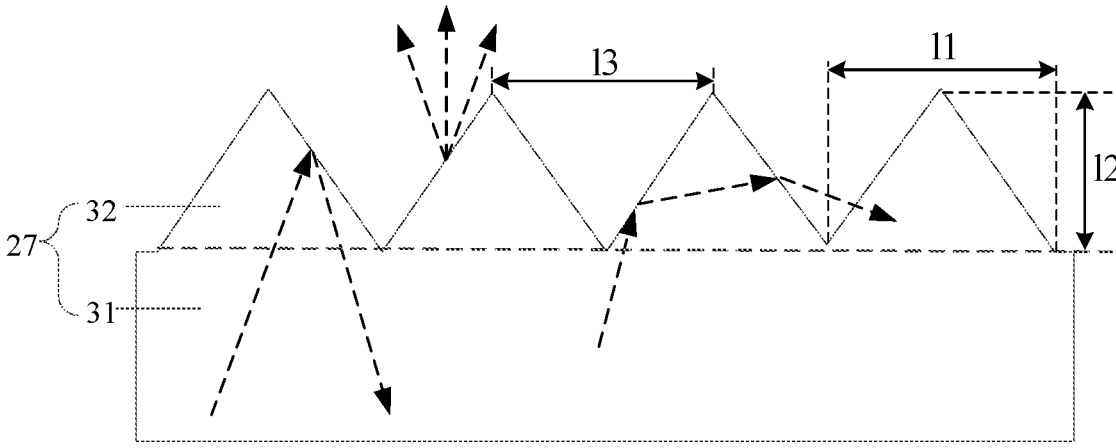
FIG. 7 is a schematic diagram of increasing a light utilization rate by a prism structure provided by an embodiment of the present disclosure.

It should be noted that as shown in FIG. 7, after the light emitted from the quantum dot layers is incident to the prism structure 27, the prism structure 27 can repeatedly reflect part of the light, which can improve the light utilization rate. In addition, the prism structure can also focus the light to a positive viewing angle. The dotted arrows in FIG. 7 represent light propagation paths.

In some embodiments, a material of the prism structure may be polyimide, acrylic resin, epoxy resin and other organic materials.

In some embodiments, as shown in FIG. 7, the prism structure 27 can be divided into a first portion 31 with a rectangular cross section and a plurality of second portions 32 with triangular cross sections. In specific implementation, for example, a length l1 of a triangle bottom of each second portion 32 is greater than or equal to 5 microns and less than or equal to 40 microns, a triangle height l2 of each second portion 32 is greater than or equal to 2 microns and less than or equal to 40 microns; and a distance l3 between vertices of the triangles of two adjacent second portions 32 is greater than 0 micron and less than or equal to 5 microns.

In some embodiments, when the light emitting devices are all blue light emitting devices, as shown in FIG. 6, an orthographic projection of the prism structure 27 on the substrate 1 does not overlap the blue sub-pixel regions B.

Figure 8:
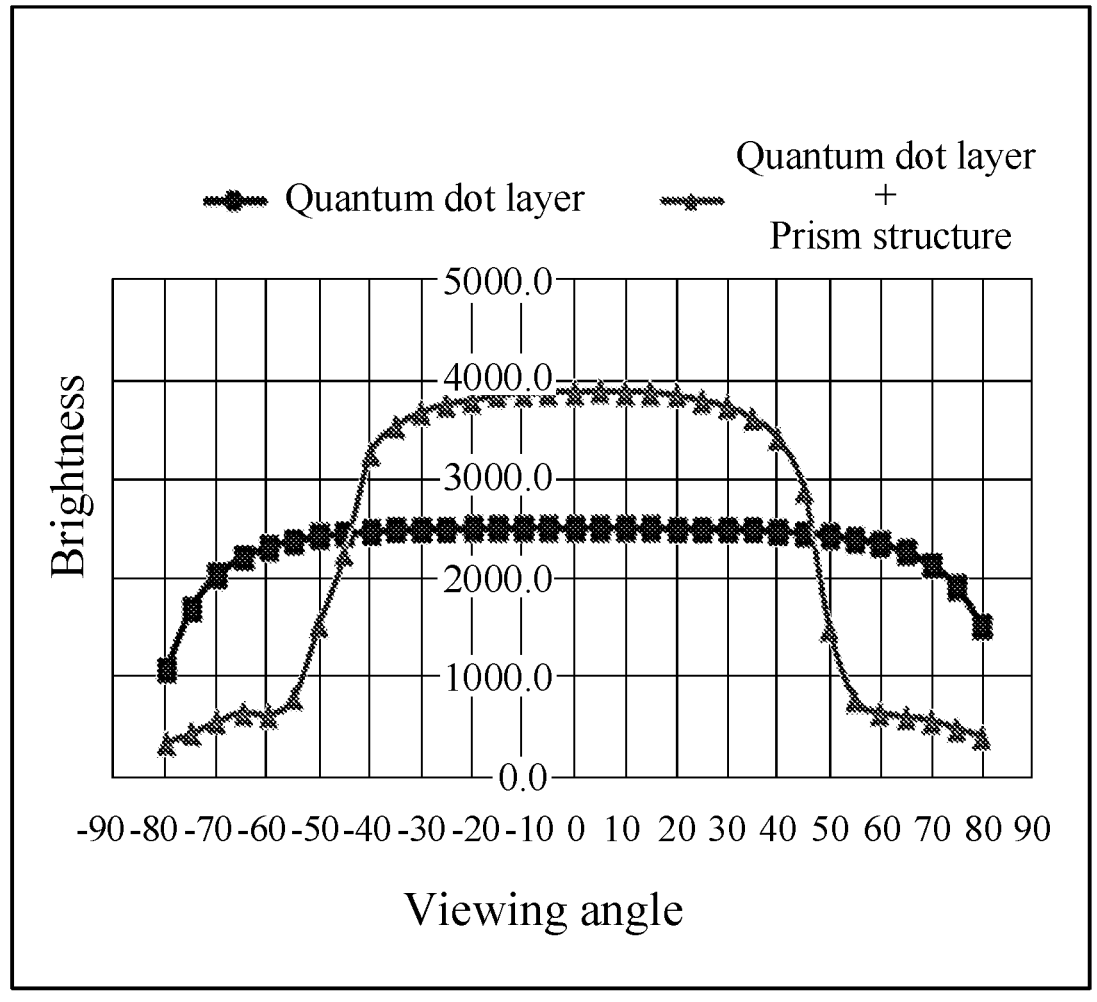
FIG. 8 is a diagram of a test result of a viewing angle-brightness relationship provided by an embodiment of the present disclosure.

A display panel with the prism structure and a display panel without the prism structure are tested, and a test result of the brightness conversion rates is as shown in FIG. 8. It can be seen from FIG. 8 that when the quantum dot layers and the prism structure are included, the brightness conversion rate is increased by 55.4% at a positive viewing angle. It can be seen that arranging the prism structure can effectively improve the light utilization rate to improve the brightness conversion rate of the quantum dot layers at the positive viewing angle.

However, as shown in FIG. 8, the brightness of the display panel with the prism structure at a large viewing angle (40°-60°) may drop sharply, which easily leads to poor brightness uniformity of the display panel at different viewing angles.

In some embodiments, as shown in FIG. 6, the display panel further includes an entire scattering layer 28 arranged on one side, facing away from the quantum dot layers 6, of the prism structure 27.

According to the display panel provided by the embodiments of this application, the scattering layer is arranged on the side, facing away from the quantum dot layers, of the prism structure, so that a sharp drop phenomenon of the brightness at a large viewing angle can be improved through a scattering effect of the scattering layer. Moreover, the scattering layer with a scattering function can also play a role of absorbing part of blue light, thus reducing the leakage of the blue light and improving the color purity of the display panel.

Figure 9:
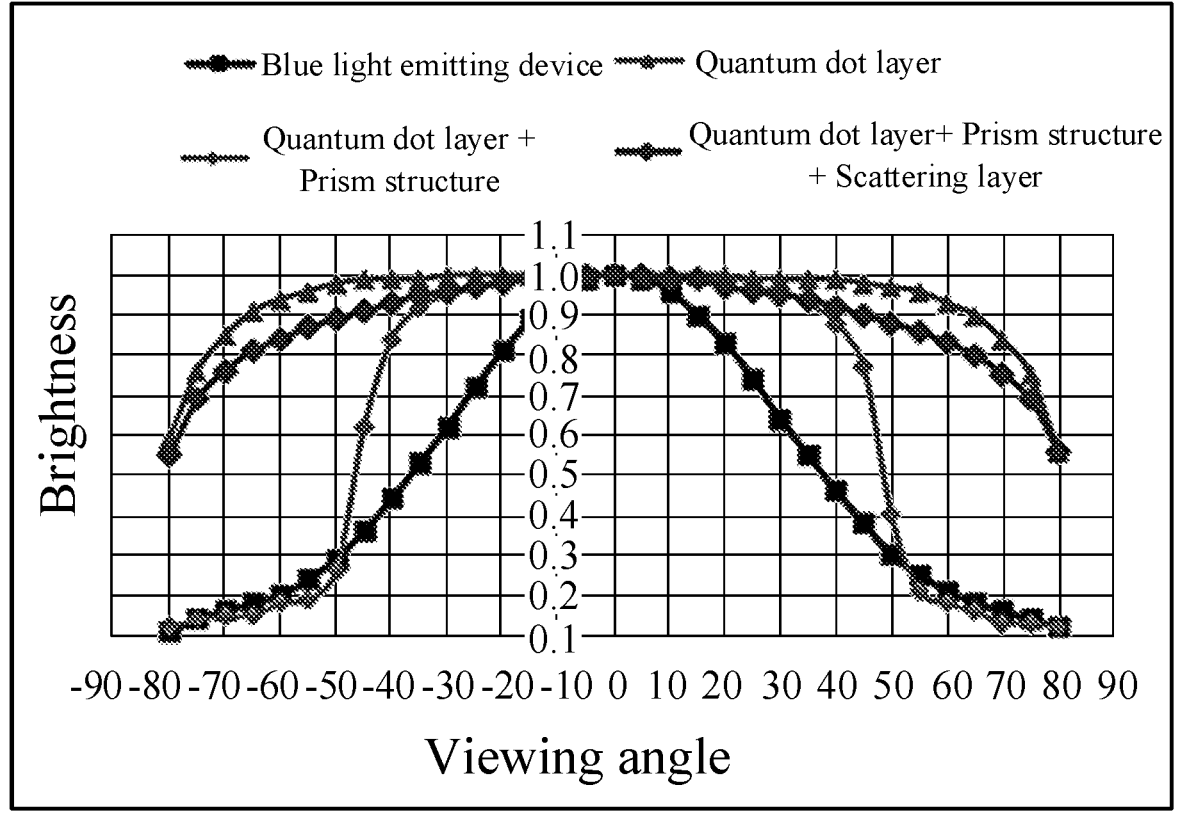
FIG. 9 is a diagram of a test result of another viewing angle-brightness relationship provided by an embodiment of the present disclosure.

The display panel with a scattering structure is tested, and a test result is as shown in FIG. 9. It can be seen from FIG. 9 that based on the scattering structure, the sharp drop of the brightness at the large viewing angle has been significantly improved, and the distribution of the brightness at viewing angles is close to the distribution of the brightness of the light emitted by the quantum dot layers.

In some embodiments, as shown in FIG. 6, the scattering layer 28 includes a flat film 29, and first scattering particles 30 dispersed in the flat film 29.

In specific implementation, the flat film may be acrylic resin, polyurethane resin, silicone resin, epoxy resin, and the like. The first scattering particles may be titanium oxide (TiO$_2$), zirconia (ZrO$_2$) and other materials.

Figure 10:
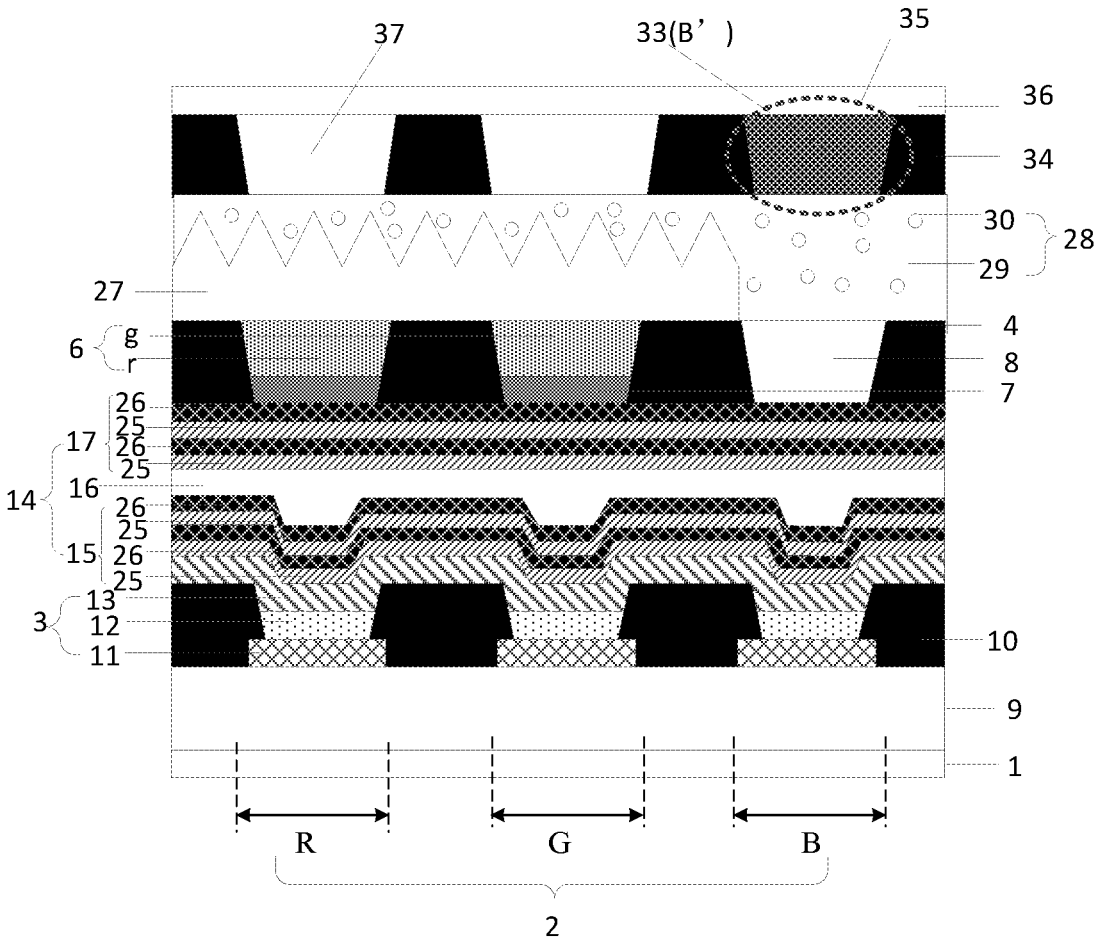
FIG. 10 is a schematic structural diagram of another display panel provided by an embodiment of the present disclosure.

In some embodiments, as shown in FIG. 10, the display panel further includes: a plurality of color resistances 33, located on one side, facing away from the first refractive index patterns 7, of the quantum dot layers 6, and located in at least part of the sub-pixel regions 2.

It should be noted that due to characteristics of quantum dots, the distribution of the brightness of the light emitted by the quantum dot layers is basically unchanged at 0°-60°, while for the blue light emitting devices, the distribution of the brightness of the light emitted by the blue light emitting devices is different from the distribution of the brightness of the light emitted by of the quantum dot layers due to a microcavity effect and other reasons, as shown in FIG. 9. This will cause brightness attenuations of red sub-pixels, green sub-pixels and blue sub-pixels of the display panel to be inconsistent at a large viewing angle, thus affecting a color deviation effect of white light. Moreover, the quantum dot layers absorb a limited amount of blue light, and the remaining blue light will affect the color purity of the devices.

According to the display panel provided by the embodiments of the present disclosure, the color resistances are arranged on one side, facing away from the first refractive index patterns, of the quantum dot layers, so that the color resistances can filter the light emitted by the quantum dot layers to improve the color purity.

In specific implementation, when the display panel includes the prism structure and the scattering layer, as shown in FIG. 10, the color resistances 33 are located on one side, facing away from the prism structure 27, of the scattering layer 28. The display panel also includes a shading layer 34 located on the same layer as the color resistances 33 and a cover plate 36 located on one side, facing away from the scattering layer, of the color resistances 33 and the shading layer 34. The shading layer 34 has third opening regions 35 corresponding to the sub-pixel regions 2 one by one, and the color resistances 33 are located in the third opening regions 35.

In some embodiments, the plurality of color resistances at least include blue color resistances corresponding to the blue sub-pixel regions one by one.

It should be noted that according to the display panel provided by the embodiments of the present disclosure, when the light emitting devices are all the blue light emitting devices, and the display panel is provided with the first refractive index patterns, the prism structure, the scattering layer and the encapsulation layer which is more than three layers, these structures can simultaneously improve the blue light utilization rate, so as to reduce the leakage of the blue light and improve the brightness conversion rate and the color purity. At this time, no color resistance may be arranged in the third opening regions corresponding to the red sub-pixel regions and the green sub-pixel regions, so as to improve the luminous efficiency of the display panel. Therefore, in some embodiments, as shown in FIG. 10, the plurality of color resistances 33 are blue color resistances B'. In specific implementation, as shown in FIG. 10, the display panel also includes: a light-transmissive filling layer 37 for filling the third opening regions corresponding to the red sub-pixel regions R and the green sub-pixel regions G.

Figure 11:
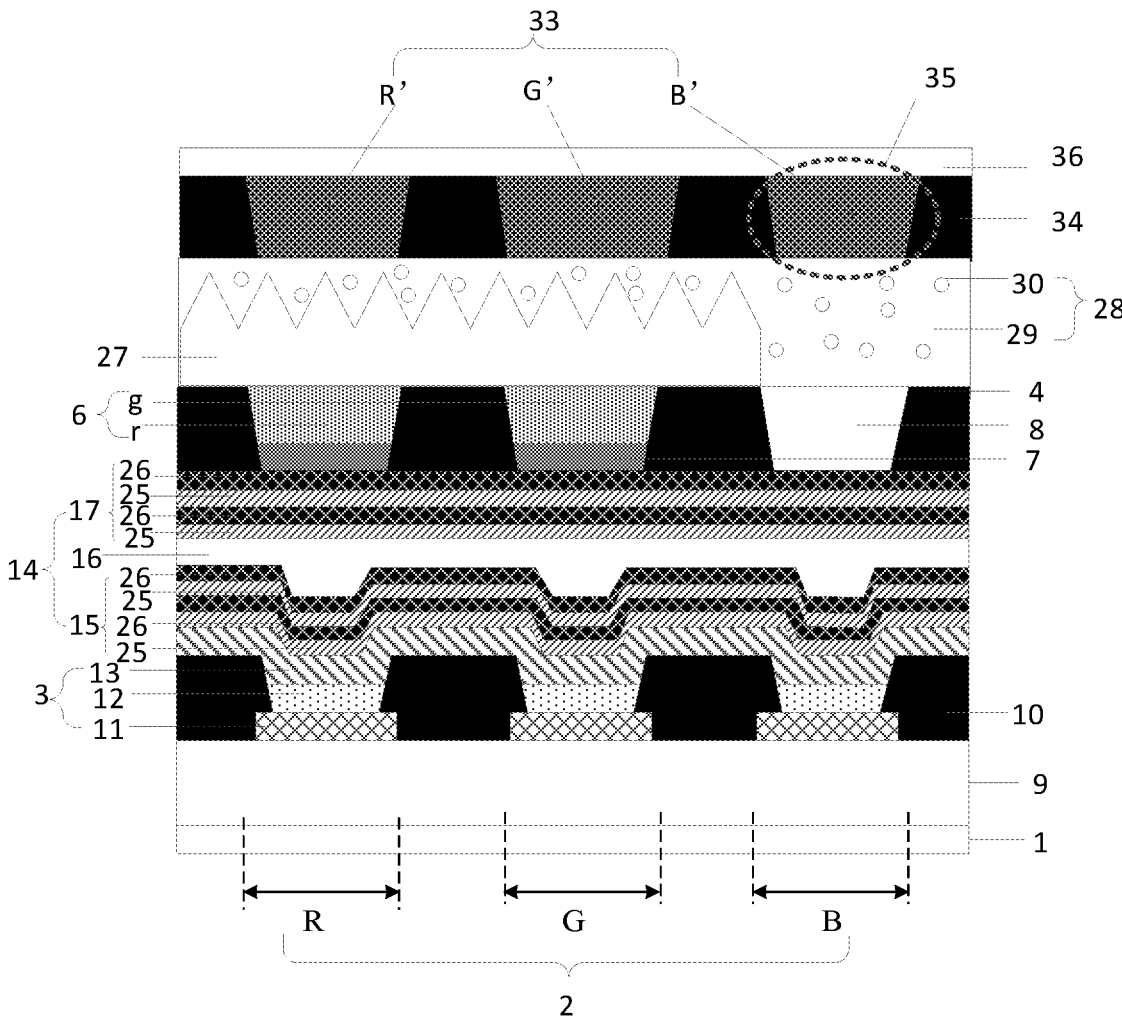
FIG. 11 is a schematic structural diagram of another display panel provided by an embodiment of the present disclosure.

Of course, in order to improve the color purity of the sub-pixels, as shown in FIG. 11, the plurality of color resistances 33 also include: red color resistances R' corresponding to the red sub-pixel regions R one by one, and a plurality of green color resistances G' corresponding to the green sub-pixel regions G one by one.

In specific implementation, a filter material includes, for example, dyes corresponding to the colors of the sub-pixels.

The dye filter material itself has a certain scattering effect, which can improve the distribution of the brightness of the blue sub-pixels at various viewing angles, so that the distribution of the brightness of the blue sub-pixels at the various viewing angles match the distributions of the brightness of the red sub-pixels and the green sub-pixels at the various viewing angles.

In some embodiments, the blue color resistances further include second scattering particles dispersed in the filter material. Thus, the distribution of the brightness of the blue sub-pixels at various viewing angles can be further improved, so that the distribution of the brightness of the blue sub-pixels at the various viewing angles matches the distributions of the brightness of the red sub-pixels and the green sub-pixels at the various viewing angles.

In some embodiments, the color resistances include the filter material and second hollow particles dispersed in the filter material.

According to the display panel provided by the embodiments of the present disclosure, the second hollow particles are dispersed in the filter material. The second hollow particles can reduce the refractive index of the color resistances, thus playing a buffer role to reduce total reflection of light at an interface between the cover plate and air and improve the luminous efficiency.

In some embodiments, a diameter of each second hollow particle is greater than or equal to 20 nm and less than or equal to 200 nm.

A display apparatus provided by embodiments of the present disclosure includes the display panel provided by the embodiments of the present disclosure.

The display apparatus provided by the embodiments of the present disclosure may be any product or component having a display function, such as a mobile phone, a tablet computer, a television, a display, a notebook computer, a digital photo frame, and a navigator. Other indispensable components of the display apparatus are all understood by those skilled in the art, and are not described herein and should not be construed as limiting the present disclosure. The implementation of the display apparatus may refer to the embodiment of the foregoing display panel, and repeated descriptions are omitted.

To sum up, according to the display panel and the display apparatus provided by the embodiments of the present disclosure, the first refractive index patterns are arranged between the quantum dot layers and the light emitting devices. The light emitted by some quantum dot layers and the light that is not absorbed by the quantum dot layers may be emitted towards one side of the first refractive index patterns. When the light is propagated to the interfaces between the quantum dot layers and the first refractive index patterns, since the refractive index of the quantum dot layers is greater than that of the first refractive index patterns, the light will be totally reflected when being propagated to the interfaces between the quantum dot layers and the first refractive index patterns, and the light that is not absorbed by the quantum dot layers will be reused. The light emitted by the quantum dot layers will also be emitted finally from the front surface of the side, facing away from the first refractive index patterns, of the quantum dot layers through multiple reflections, so that the light utilization rate can be improved, and the brightness conversion rate of the quantum dot layers can be improved. In addition, the leakage of the light emitted by the light emitting devices can be reduced, and the color purity of the display panel can be improved.

Although the preferred embodiments of the present disclosure have been described, those skilled in the art can make other changes and modifications to these embodiments once they acquire the basic creative concept. Therefore, attached claims are intended to be explained as including the preferred embodiments and all the changes and modifications that fall within the scope of the present disclosure.

Obviously, those skilled in the art can make various changes and transformations to the embodiments of the present disclosure without departing from the spirit and scope of the present disclosure. Therefore, if these changes and transformations of the embodiments of the present disclosure fall within the scope of the claims of the present disclosure and equivalent technologies of the present disclosure, the present disclosure is intended to include these changes and transformations.

What is claimed is:

1. A display panel, wherein the display panel comprises:
a substrate, comprising a plurality of sub-pixel regions;
a plurality of light emitting devices, arranged on one side of the substrate and corresponding to the plurality of sub-pixel regions one by one;
a first pixel definition layer, arranged on one side, facing away from the substrate, of the plurality of light emitting devices; wherein the first pixel definition layer comprises first opening regions corresponding to the plurality of sub-pixel regions one by one;
a plurality of quantum dot layers, arranged on the side, facing away from the substrate, of the plurality of light emitting devices; wherein the plurality of quantum dot layers are arranged in at least part of the first opening regions;
a plurality of first refractive index patterns, arranged between the plurality of light emitting devices and the plurality of quantum dot layers, wherein a refractive index of each of the plurality of quantum dot layers is greater than that of each of the plurality of first refractive index patterns; and
a prism structure arranged on one side, facing away from the plurality of first refractive index patterns, of the plurality of quantum dot layers.

2. The display panel according to claim 1, wherein the plurality of first refractive index patterns comprise resin and first hollow particles dispersed in the resin.

3. The display panel according to claim 2, wherein a diameter of each of the first hollow particles is greater than or equal to 20 nm and less than or equal to 200 nm.

4. The display panel according to claim 1, wherein the display panel further comprises:
second refractive index patterns, at least arranged between a side surface of the first pixel definition layer and the plurality of quantum dot layers.

5. The display panel according to claim 4, wherein a refractive index of each of the second refractive index patterns is less than that of each of the plurality of quantum dot layers.

6. The display panel according to claim 1, wherein the display panel further comprises:

an encapsulation layer, arranged between the plurality of first refractive index patterns and the plurality of light emitting devices; wherein the encapsulation layer comprises a first inorganic encapsulation film, an organic encapsulation film and a second inorganic encapsulation film which are stacked;
wherein at least one of the first inorganic encapsulation film and the second inorganic encapsulation film comprises: at least one group of first inorganic encapsulation sub-films and second inorganic encapsulation sub-films alternately arranged; and
a refractive index of each of the first inorganic encapsulation sub-films is greater than a refractive index of each of the second inorganic encapsulation sub-films.

7. The display panel according to claim 6, wherein each first inorganic encapsulation sub-film and each second inorganic encapsulation sub-film satisfy a following condition:

$$\lambda/(4 \times N_1) + \lambda/(4 \times N_2) = H_1 + H_2,$$

wherein $\lambda$ is a central wavelength of reflected light of an interface between the first inorganic encapsulation sub-film and the second inorganic encapsulation sub-film; $N_1$ is the refractive index of the first inorganic encapsulation sub-film; $N_2$ is the refractive index of the second inorganic encapsulation sub-film; $H_1$ is a thickness of the first inorganic encapsulation sub-film; and $H_2$ is a thickness of the second inorganic encapsulation sub-film.

8. The display panel according to claim 1, wherein the display panel further comprises an entire scattering layer arranged on one side, facing away from the plurality of quantum dot layers, of the prism structure.

9. The display panel according to claim 8, wherein the scattering layer comprises a flat film and first scattering particles dispersed in the flat film.

10. The display panel according to claim 1, wherein the plurality of light emitting devices are blue light emitting devices;
the plurality of sub-pixel regions comprise: a plurality of red sub-pixel regions, a plurality of blue sub-pixel regions, and a plurality of green sub-pixel regions; and
the first refractive index patterns and the quantum dot layers are only arranged in first opening regions corresponding to the plurality of red sub-pixel regions and the plurality of green sub-pixel regions.

11. The display panel according to claim 10, wherein an orthogonal projection of the prism structure on the substrate and the plurality of blue sub-pixel regions do not overlap each other.

12. The display panel according to claim 1, wherein the display panel further comprises:
a plurality of color resistances, arranged on one side, facing away from the plurality of first refractive index patterns, of the plurality of quantum dot layers;
wherein the plurality of color resistances are arranged at least in part of the plurality of sub-pixel regions.

13. The display panel according to claim 12, wherein the plurality of color resistances comprise a filter material and second hollow particles dispersed in the filter material.

14. The display panel according to claim 9, wherein the plurality of sub-pixel regions comprise: a plurality of red sub-pixel regions, a plurality of blue sub-pixel regions, and a plurality of green sub-pixel regions; and the plurality of color resistances are all blue color resistances, and the plurality of color resistances at least comprise the blue color resistances corresponding to the blue sub-pixel regions one by one.

15. The display panel according to claim 14, wherein the plurality of color resistances further comprise: red color resistances corresponding to the red sub-pixel regions one by one, and a plurality of green color resistances corresponding to the green sub-pixel regions one by one; and the blue color resistances further comprise second scattering particles dispersed in the filter material.

16. The display panel according to claim 1, wherein a refractive index of each of the plurality of first refractive index patterns is greater than or equal to 1.25 and less than or equal to 1.45.

17. The display panel according to claim 1, wherein a thickness of each of the plurality of first refractive index patterns is greater than or equal to 1 micron and less than or equal to 4 microns.

18. A display apparatus, comprising the display panel according to claim 1.

19. A display panel, wherein the display panel comprises:

a substrate, comprising a plurality of sub-pixel regions;

a plurality of light emitting devices, arranged on one side of the substrate and corresponding to the plurality of sub-pixel regions one by one;

a first pixel definition layer, arranged on one side, facing away from the substrate, of the plurality of light emitting devices; wherein the first pixel definition layer comprises first opening regions corresponding to the plurality of sub-pixel regions one by one;

a plurality of quantum dot layers, arranged on the side, facing away from the substrate, of the plurality of light emitting devices; wherein the plurality of quantum dot layers are arranged in at least part of the first opening regions; and a plurality of first refractive index patterns, arranged between the plurality of light emitting devices and the plurality of quantum dot layers, wherein a refractive index of each of the plurality of quantum dot layers is greater than that of each of the plurality of first refractive index patterns;

wherein the plurality of light emitting devices are blue light emitting devices;

the plurality of sub-pixel regions comprise: a plurality of red sub-pixel regions, a plurality of blue sub-pixel regions, and a plurality of green sub-pixel regions;

the first refractive index patterns and the quantum dot layers are only arranged in first opening regions corresponding to the plurality of red sub-pixel regions and the plurality of green sub-pixel regions; and when the display panel further comprises a prism structure, an orthogonal projection of the prism structure on the substrate and the plurality of blue sub-pixel regions do not overlap each other.

20. The display panel according to claim 19, wherein the plurality of first refractive index patterns comprise resin and first hollow particles dispersed in the resin.

* * * * *